United States Patent [19]

Bendat et al.

[11] Patent Number: 4,899,921
[45] Date of Patent: Feb. 13, 1990

[54] ALIGNER BONDER

[75] Inventors: Zvi Bendat, East Brunswick; David A. Leggett, North Plainfield, both of N.J.

[73] Assignee: The American Optical Corporation, Southbridge, Mass.

[21] Appl. No.: 263,709

[22] Filed: Oct. 28, 1988

[51] Int. Cl.$^4$ ............... H01L 21/68; H01L 21/58
[52] U.S. Cl. ............... 228/105; 228/6.2; 228/180.2; 358/101
[58] Field of Search ............... 228/105, 180.2, 6.2; 358/101

[56] References Cited

U.S. PATENT DOCUMENTS

| | | | |
|---|---|---|---|
| 3,357,091 | 12/1967 | Reissmueller et al. | 228/105 |
| 3,581,375 | 6/1971 | Rottmann | 228/180.2 X |
| 3,586,813 | 6/1971 | Cruickshank | 228/180.2 |
| 3,696,985 | 10/1972 | Herring et al. | 228/180.2 X |
| 3,709,424 | 1/1973 | Drees | 228/180.2 X |
| 3,774,834 | 11/1973 | Holler et al. | 228/6.2 X |
| 3,785,507 | 1/1974 | Wiesler et al. | 228/105 X |
| 3,793,710 | 2/1974 | Monahan et al. | 228/6.2 X |
| 3,838,274 | 9/1974 | Doubek, Jr. et al. | 228/105 |
| 3,840,978 | 10/1974 | Lynch et al. | 228/110 X |
| 3,843,036 | 10/1974 | Monahan et al. | 228/6.2 |
| 3,859,723 | 1/1975 | Hamer et al. | 228/180.2 |
| 3,941,297 | 3/1976 | Burns et al. | 228/180.2 |
| 3,946,931 | 3/1976 | Bahnck et al. | 228/180.2 X |
| 3,958,740 | 5/1976 | Dixon | 228/180.2 X |
| 3,982,979 | 9/1976 | Hentz et al. | 228/180.2 |
| 4,103,814 | 8/1978 | Nishioka | 228/180.2 |
| 4,116,376 | 9/1978 | Delorme et al. | 228/6.2 |
| 4,295,596 | 10/1981 | Doten et al. | 228/180.2 |
| 4,342,090 | 7/1982 | Caccoma et al. | 228/180.2 X |
| 4,389,669 | 6/1983 | Epstein et al. | 358/101 |
| 4,573,627 | 3/1986 | Miller et al. | 228/180.2 |
| 4,663,658 | 5/1987 | Lanne et al. | 358/101 |

OTHER PUBLICATIONS

Arndt, H. L., IBM Technical Disclosure Bulletin entitled "Optical Alignment Apparatus for Microelectronics Packaging", Jan. 1968, pp. 1250–1251, vol. 10, No. 8.

Primary Examiner—Kenneth J. Ramsey
Attorney, Agent, or Firm—Brumbaugh, Graves, Donohue & Raymond

[57] ABSTRACT

An aligner bonder for joining parts of a miniature semiconductor component, for example, comprises supports for holding the parts with surfaces facing, positioning provisions for adjusting relative positions and inclinations of the parts and for bringing the facing surfaces together for bonding. A first inclined two-sided mirror directs light from a pair of illuminators to the surfaces. Images of the surfaces are diverted from the inclined reflective mirror faces to optical paths and then to video cameras. Individual video circuitry and illuminator adjustments permit adjustment of each video image. The images are combined in a single video image displayed on a monitor. The supports for the parts are positionally adjusted to bring the video images into alignment. To adjust parallelism, autocollimators and associated reference image cross hairs project reference images via another inclined two-sided mirror to the surfaces of the parts or parallel reference surfaces. The reference image projected to the surfaces are reflected back to the video cameras via the reflective faces of the second two-sided mirror and associated optical paths. The positional relationship of the two reference images, as they appear in a combined video display are indicative of the relative inclination of the surfaces and can be adjusted to bring the surfaces parallel before retracting the probe from between the surfaces, bringing together the surfaces and bonding the parts.

24 Claims, 3 Drawing Sheets

ALIGNER BONDER

BACKGROUND OF THE INVENTION

This invention is directed to a method and apparatus for effecting precise alignment and bonding between surfaces, and in particular to methods and apparatus for aligning and bonding an integrated circuit wafer or chip and a patterned substrate.

Precise alignment of surfaces to be joined together has received continuing attention, particularly in the formation of electronic devices where, as in VLSI circuit elements, the patterning is microscopic or nearly microscopic. While the features and techniques of this invention are believed useful in any application that requires precisely aligning opposing surfaces, it will be described herein relative to the formation of integrated circuit devices, particularly VLSI devices, where the problem of positional alignment becomes more and more critical as circuit element, conductor, and connection point size is dramatically reduced.

Most particularly, in the manufacture of integrated circuits, it is necessary to have the capability to effect a precisely aligned bond between two parts. One may be an integrated circuit wafer or individual chip, which may have tiny solder, epoxy, or indium bumps formed thereon. The other may be a patterned substrate that comprises a pattern of tiny pads or conductors to be used as the electrical connections to the integrated circuit chip, or it may be the patterned surface of another semiconductor wafer, integrated circuit, or circuit part to be stacked. Herein, an upper part shall be referred to as a die and a lower part as a substrate. The bumps referred to are used to fuse the die to preselected points, such as conductive pads in the patterned substrate, after the two surfaces have been precisely aligned. Bonding is usually effected by known methods utilizing application of one or more of heat, pressure, or ultrasonic vibrations.

According to some prior methods or instruments for effecting alignment, two parts are positioned while they are spaced well apart, and thereafter, one is moved a considerable distance into contact with the other. Other instruments locate two elements to be joined in relation to reference marks, then move them together and join them. Such approaches introduce the likelihood, however, of misalignment of the surfaces when the areas to be joined are extremely small, e.g. measured in microns. The greater the distance a surface has to move, the greater is the alignment error that results from the smallest imprecision in the instrument's machined parts. An instrument available from the assignee of the current invention takes advantage of the transparency of certain semiconductors to infrared light by illuminating with infrared a die in place on a substrate to produce a video image. This works well when one part is transparent to infrared. But that part, the upper part, must have a polished surface to avoid a "frosted glass" type of diffusion that prevents visibility of the under surface through the overlying part. Another proposed apparatus looks down upon an upper part, and the operator, or electrical detectors, notes the correct alignment of its outline, not its actual connection points, with the underlying substrate. This only assumes that the points of contact are correctly positioned for bonding, and like many of the currently known pieces of equipment, it gives no indication of parallelism between the surfaces. Since lack of parallelism, lack of alignment, or both can result in the absence of a required electrical connection or an incorrect connection, to determine that connections are as desired when the chip and substrate surfaces have been contacted, but not yet bonded, continuity checks have been employed in which current has been supplied via connectors of the device being assembled and outputs have been measured. This is time-consuming and requires an understanding of what the effect will be of applying current through the available connections to the parts being joined.

In the patent literature, there is proposed the production of a combined optical image of a beam lead integrated circuit device and a spaced substrate such as a PC board to which the device is to be attached. An optical imaging arrangement is introduced between the beam lead IC and the board. The optics direct images of the surfaces to a mirror located to be viewed by microscope. Alignment is checked by viewing the combined images through the microscope. However, there is not the ability to adjust the relative magnification, brightness or contrast of one image relative to the other to assure accuracy of the composite image. The device and substrate are relatively large, as are the areas to be joined. Continual microscope use to view alignment is less desirable than observance of a greatly enlarged image displayed on a screen and easily viewed.

Prior combined image producing instruments often do not have the ability to explore portions of the surfaces to be joined, but rather concentrate on the whole surface. Additionally, these instruments may fail to suggest a check for parallelism.

BRIEF SUMMARY OF THE INVENTION

According to the present invention an aligner bonder effects a precise, certain joinder of closely spaced die and substrate surfaces by producing combined, greatly magnified, and easily observable, superimposed video images of closely proximate surfaces. Parallelism can be arrived at using the same video screen by bringing into alignment reference mark images reflected from the two surfaces or reference surfaces provided for that purpose.

The aligner bonder has an optical probe movable from one location to another to explore aligned portions of the surfaces to be joined. Each opposing surface is illuminated by its own individual light source for imaging. Each has its own video camera. In the combined video image each surface's image can be adjusted individually, either by adjusting video features such as intensity, contrast, etc. or by controlling the level of illumination from the surface's light source. The aligner bonder is controlled to bring the surfaces of the minutely patterned die and substrate into desired alignment by movement of the support for one of the objects in orthogonal x and y directions, and in a rotational $\theta$ direction. Adjustment of angles of inclination $\phi$ and $\psi$ of the adjustable support for parallelism of the surfaces is accomplished by observing the superimposed video images of the reference marks, which are projected to and reflected from the die and substrate surfaces to be bonded together, or reference surfaces.

The relative magnification of the surface images that are superimposed for alignment can be varied slightly by adjustment of the distances from the probe to the surfaces. Illumination along the optical axes and onto the die and substrate surfaces, in a direction perpendicular to those surfaces, eliminates illumination shadowing so as to make the alignment of the surfaces more quickly and easily accomplished.

Preferred embodiments of instruments according to this invention enable the foregoing operations by the combination of a video system and an optical system including a thin, retractable optical probe for moving between the surfaces to be brought together. A die and a patterned substrate are affixed to supports and are positioned with the surfaces to be brought together facing one another a small distance apart. The instrument's optical probe is moved into place between the supports. Video displays of the reference mark images projected onto the facing surfaces of the die and substrate, or onto facing reference surfaces, are viewed in the video monitor and brought into coincidence. This is accomplished by optics utilizing a first of two objectives on the probe. Autocollimators illuminate, for example, cross hairs or cross hair reticles therein to produce the reference images. These are directed along individual optical paths and then to the facing surfaces by the objective, which is a mirror with diagonally inclined reflective faces between the surfaces. Reflected back from the facing surfaces along optical paths defined in the instrument's probe and optics, individual video cameras receive the reference mark images. A mixer combines the video images which are then displayed on the monitor. The reference mark images indicate parallelism of the surfaces to be joined when their superimposed video images on the monitor coincide.

To align the die and substrate points to be joined, the optical probe is now moved slightly to bring a second objective between the die and the substrate. A pair of illuminators are now used to direct light to the facing surfaces of the die and substrate along the axes of imaging optical paths used for viewing the surfaces. The objective is a mirror cube with inclined reflective faces forming a two-sided mirror which directs light to the surfaces and receives the images of portions of the facing surfaces. The imaging optical paths of the probe and optical system direct the images of the die and substrate surfaces to the two television cameras of the video system. The mixing circuit and the monitor superimpose the images of the portions of die and substrate surfaces for viewing by the operator. Moving from location to location by moving the probe, the operator makes adjustments to linearly and angularly adjust the relative positioning of the supports to precisely align each of the surface areas to be joined. Once the operator is satisfied with the alignment and parallelism, he or she retracts the optical probe. One surface is moved the small distance necessary to contact the other, and by conventional means, e.g. heat, pressure, and/or vibration the points of contact are joined. Because the probe is thin, the spacing between the die and substrate can be relatively small and the movement necessary to bring the surfaces together is minimized, reducing the likelihood of lateral movement being introduced when the die and substrate are moved together.

Preferably, during set-up of the instrument, to enable bringing the surfaces accurately together, calibration is effected to assure that the upper and lower supports or chucks are parallel. A calibration unit or bridge including microscope optics, an illuminator and an autocollimator is used. A target reticle mount is positioned above the lower support. A lower target reticle and an upper transparent target reticle on the mount are viewed through the optics to establish parallelism by establishing coincidence of the target reticle images using each of the autocollimator and illuminator.

For a better understanding of the invention, as well as other objects and further features thereof, reference is made to the following detailed description of the preferred embodiments which makes reference to the accompanying drawings.

DETAILED DESCRIPTION OF THE PREFERRED EMBODIMENT

Figure 1:
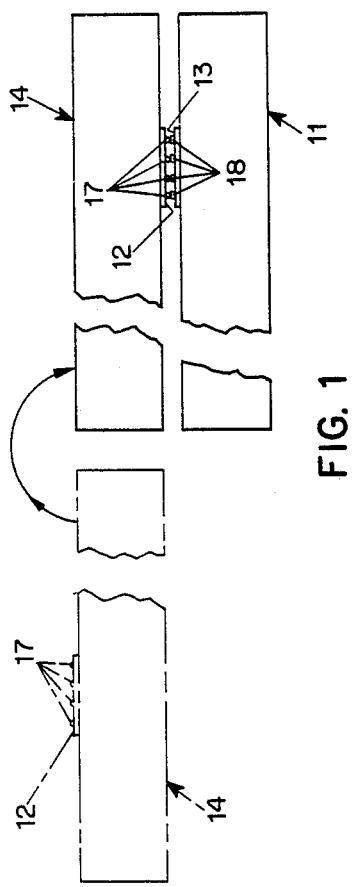
FIG. 1 is a diagrammatic illustration of the prior art practice of aligning a die and substrate using a "flip chip" aligner bonder.

FIG. 1 illustrates, in greatly simplified manner, the desired operation of a flip chip aligner bonder. A wafer or chip 12 of semiconductor material, herein referred to as a die, carries an etched or otherwise produced pattern with tiny indium, epoxy or solder bumps 17. A pivotal support or carrier, generally indicated at 14, holds the die 12. A substrate 13, to which the die 12 is to be connected, is secured on a further support, generally indicated at 11. The substrate typically carries a pattern of conductors or pads 18 that must be aligned with and electrically connected to the pattern on the die at the locations of the bumps 17. The bumps are provided for that purpose. To enable securing the die in place, the carrier is pivotal, capable of being flipped from a position with its die support surface facing upward and accessible, as shown in phantom in FIG. 1, to a position with its die support surface facing downward as required to bring together the surfaces of the parts to be joined. The equipment used to align the die and substrate must be carefully designed to avoid the introduction of positional error. But with very large scale integrated circuitry the minute sizes of the elements to be joined, often only a few microns in width, make the likelihood of misalignment considerable. The greater the amount of relative movement of the facing parts after positioning for alignment, the more likely it is that misalignment will result when the parts are brought together.

Figure 2:
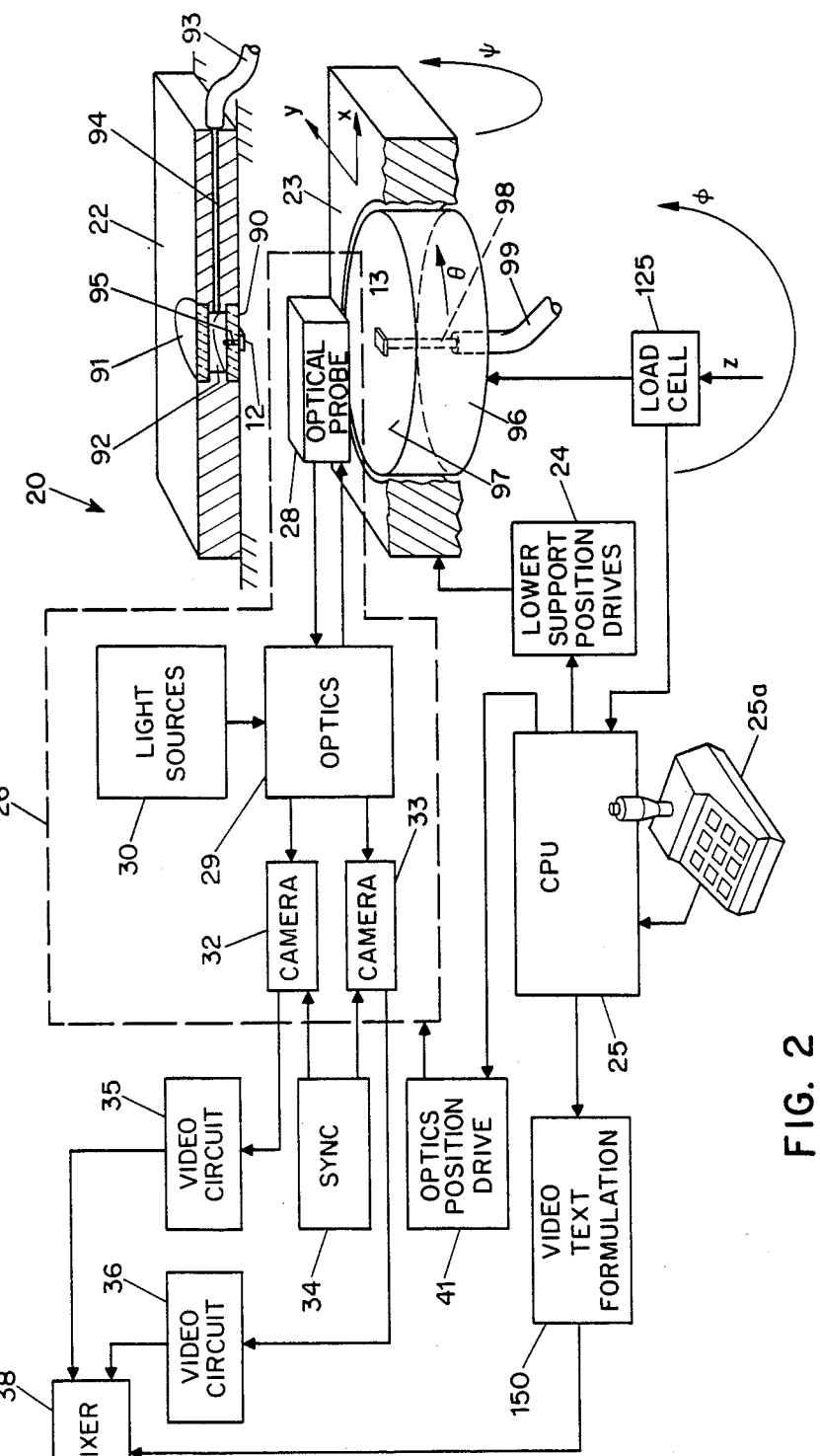
FIG. 2 is a diagrammatic illustration partially in block diagram form of the aligner bonder of the present invention.

Shown diagrammatically in FIG. 2, an aligner bonder 20 according to the invention has a pair of chucks, called herein upper and lower supports 22 and 23, on which are held the die 12, and the substrate 13. Both the die and the substrate are as shown in FIG. 1. Manually controlled precision position adjusting means include lower support position drives 24, which may be conventional DC motor drives (not individually shown) controlled from a CPU 25 and a manual, joystick controller 25a. The position drives 24 provide manually controlled positional adjustment of the lower support 23 in orthogonal x and y directions, generally parallel the planes of facing supporting surfaces of the supports 22 and 23, in a rotational $\theta$ direction, again parallel to the planes of the support surfaces, in angles of inclination $\phi$ and $\psi$, and in a z direction normal to the planes of the supports. Using the controller 25a of the aligner bonder 20, then, by relative adjustment of the support 23 in the $\phi$ and $\psi$ directions, exact parallelism between the surfaces of the die and the substrate can be attained, and the positions of points on the die and the substrate can be aligned by relative x, y and $\theta$ movement. Likewise, relative movement of the supports in the z direction can then bring the surfaces together at the aligned areas, e.g. the bumps and conductors of the exemplary die and substrate, for bonding conventionally, using pressure, heat, vibration or a combination of these. A load cell 125 is provided capable of determining when the chip and substrate are in contact and monitoring the pressure applied between the die and substrate during bonding.

A combined optical and video unit 26 has a retractable optical probe 28, associated optics 29, light sources 30, and a pair of video cameras 32 and 33. As described in greater detail below, the camera 32 views the surface of the substrate 13 via the optics 29 and probe 28, and the camera 33 views the surface of the die 12 via the optics and probe. Using a known synchronizing circuit 34 the sweeps of the two cameras 32 and 33 are synchronized. The substrate surface image video signal of the camera 32 and the die surface image video signal of the camera 33 are each directed to their own individual video signal circuitry 35 and 36, respectively, and then to a known mixing circuit 38, where they are combined so as to produce a composite image of facing areas of the die and substrate surfaces superimposed in a single display on a video monitor 40.

A drive 41 is connected to the optical and video unit 26 to move the unit to and from a position in which the probe 28 is between the die and the substrate. The drive 41 is also effective to adjust the position of the optical and video unit so that the probe 28 can be moved to view various portions of the opposed die and substrate surfaces.

Initially, the upper support 22 may be flipped over in the position shown in phantom outline in FIG. 1, with the die supporting surface thereof facing upward. The support 22 includes first and second plates 90 and 91 spaced slightly to form a vacuum chamber 92. A vacuum supply line 93 communicates with the chamber 92 via a passage 94. The die 12 is positioned to cover an aperture 95 opening through the plate 90, where it is held by vacuum applied by the line 93 from a vacuum source (not shown).

The lower chuck or support 23 includes a rotational piston-like riser 96 capable of being driven upward and with an upper support surface 97 for the substrate 13.

Figure 7:
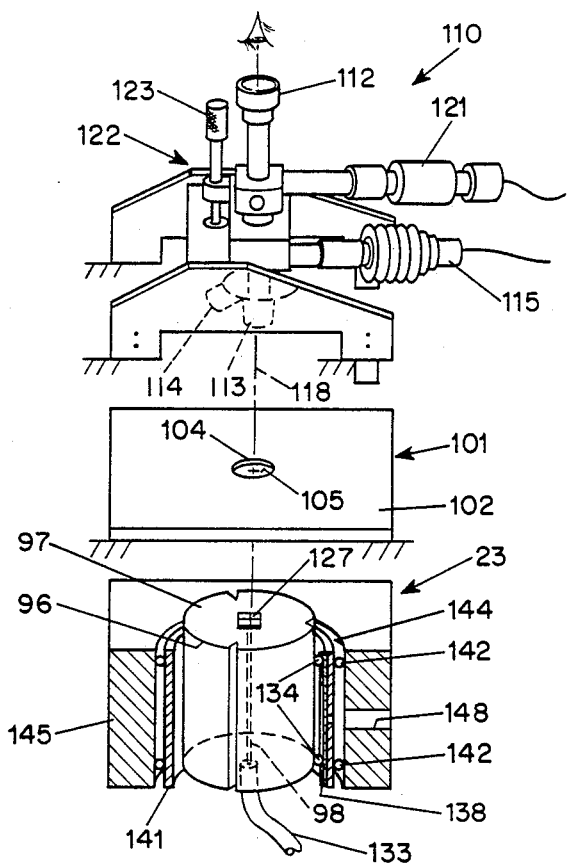
FIG. 7 is a diagrammatic illustration, partly in section of the lower support of an aligner bonder of the invention, an upper calibration target reticle support, and a calibration bridge in place above these two supports.
Figure 8:
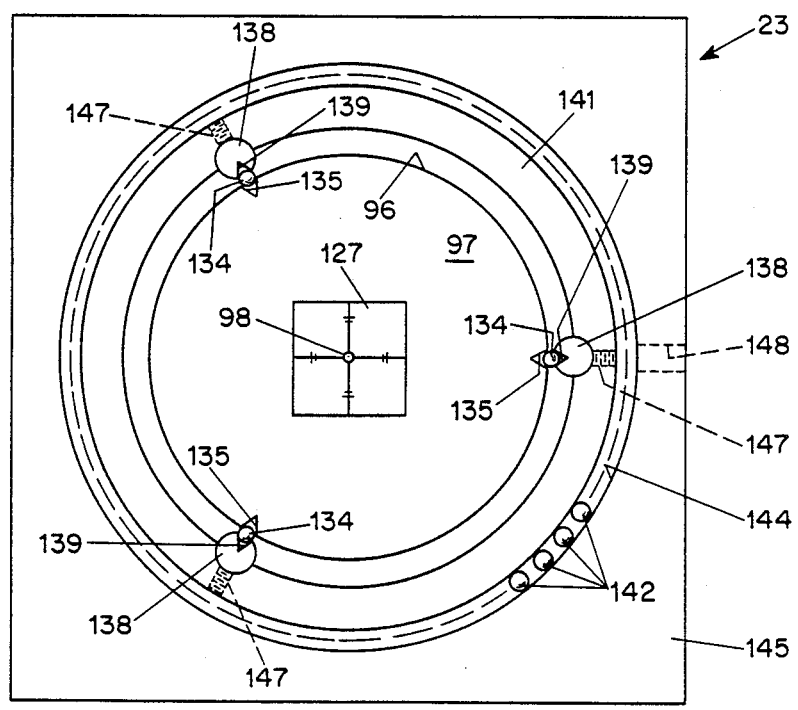
FIG. 8 is a top plan view of the lower support including bearing arrangements allowing its vertical and rotational positioning.

The riser and its related structure is described in greater detail relative to FIGS. 7 and 8 below. A vacuum passage 98 opens centrally through the upper surface 97 and is served by a vacuum line 99 connected by a vacuum source (not shown). The substrate 13 is positioned centrally over the vacuum opening of the passage 98 and is held there by vacuum applied from the line 99 and the vacuum source.

With the die held in place, the upper support 22 is flipped over to face the die downward. The support 22 can be moved into place above the lower support 23 and clamped firmly there.

Figure 3:
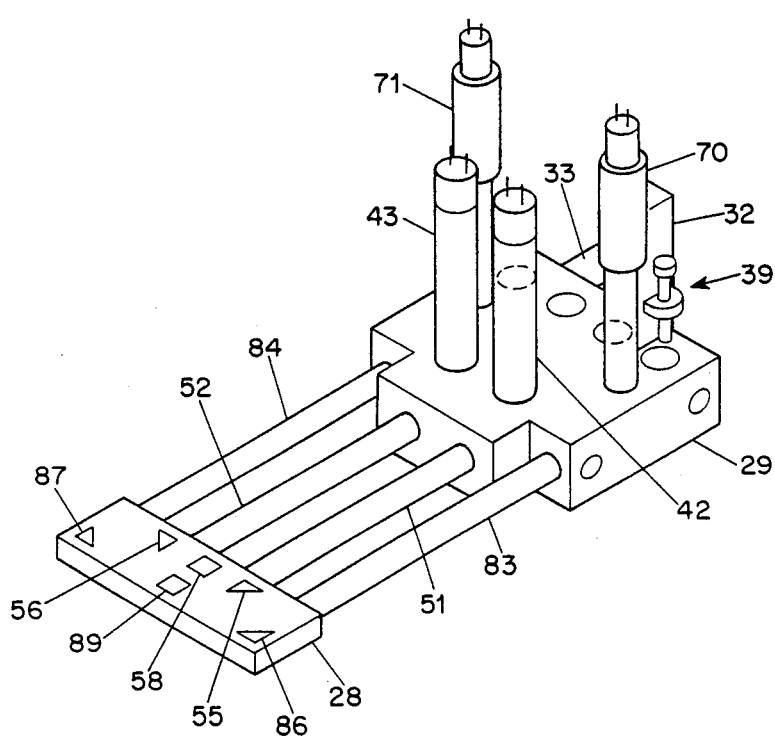
FIG. 3 is an enlarged perspective view of the optical components and optical head or probe of the present invention.

The optics position drive 41 is activated using the controller 25a to introduce the probe 28 between the supports. Adjustment of the relative inclination of the die and substrate for parallelism, using the controller 24 and the position drives 24 for movement in the $\phi$ and $\psi$ directions, which occurs next, is better described in connection with FIGS. 3 and 4, which show in greater detail the optical and video unit 26 of the aligner bonder. To establish parallelism, the illumination system employs two autocollimators 70 and 71. In the path of the collimated light from these are a pair of cross hairs 74 and 75. Images of these crossed, orthogonal lines are projected to the surfaces Of the substrate and die, or to reference surfaces provided for that purpose when the nature of the chip and substrate surfaces are not suitable for reflection of the cross hair images. The image of the cross hairs 74 is projected to the surface of the substrate 13, or a parallel reference surface, via a beam splitter 77, a lens 80 in a tube 83, a reflective external surface of the 45° hypotenuse of a right angle prism 86, and a 45° mirror 89, which is the objective facing the die and substrate surfaces. The image of the cross hair 75 is projected to the surface of the die 12 (or a parallel reference surface) via a beam splitter 78, a lens 81, a right angle prism acting as a 45° mirror 87, and the 45° mirror 89. The image of the cross hair 74 is returned from the surface of the mirror 89, the 45° mirror surface of the prism 86, the collimating lens 80, through the beam splitter 77, to a 45° reflective surface of a right angle prism 90, a beam splitter 60, a 45° reflective surface of the right angle prism 63, to the video camera 32. The image of the cross hair 75 is returned from surface of he substrate 13, or reference surface, via the downward facing 45° reflective surface of the mirror 89, the 45° mirror surface of the prism 87, the lens 81, through the beam splitter 78, through a lens 91, a right angle prism 92, a beam splitter 61, to the camera 33. The light path from the substrate to the camera 33 uses a lens pair to deliver the cross hair image, rather than just the single lens of the light path from the die to the camera 32, in order to correct the relationship of the superimposed video images. The additional lens inverts the image so that corresponding video image portions align when the facing surfaces of the die and the substrate are parallel and so that adjustment of inclination of the support 23 to bring into coincidence the two cross hair video images on the monitor results in parallelism between the die and substrate surfaces.

Figure 6:
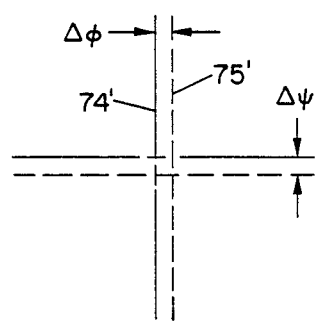
FIG. 6 is a fragmentary view of a video image made by the aligner bonder of FIG. 2 and shows cross hair images projected onto the surfaces of an integrated circuit chip and patterned substrate to be bonded.

Referring to FIG. 6, the superimposed video images 74' and 75' of the two cross hair reticles 74 and 75 are seen. The angular inclination of one of the facing surfaces of the die and substrate with respect to the other of the facing surfaces, in the $\phi$ direction appears as $\Delta\phi$. The angular inclination of one of the two facing surfaces with respect to the other surface in the $\phi$ direction appears as $\Delta\psi$. The surfaces are parallel when the two images 74' and 75' are coincident. Thus the operator of the aligner bonder employs the φ and ψ adjusting positioning provisions of the position control 24 to bring the images 74' and 75' into coincidence.

Figure 2A:
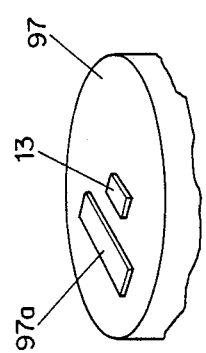
FIG. 2a is an enlarged fragmentary view of a lower support and reference surface for use in place of a substrate surface in parallelism correction.

As shown in FIG. 2a, when the substrate 13 has a surface that is not suitable for reflection of the cross hair image, then a raised reference surface 97a, machined and polished to be parallel to the substrate surface and to be reflective, can be provided for the purpose of reflecting the cross hair image to establish parallelism. A similar, aligned surface (not shown) can be provided directly above the reference surface 97a, on the plate 90, for reflection of the remaining cross hair image. Depending on the size and shape of the die and the substrate, it may be necessary to tailor a holder for either or both, so that the appropriate surface is held parallel to the surface of support 22 or 23 of the aligner bonder. In that case, the holder can, itself, be machined and polished to provide the necessary reference surface.

Assured of parallelism, the operator switches to the alignment adjust mode using the controller 25a. The operator uses the optics position drive 41 to bring a second objective 58 between the die and the substrate. Using a pair of illuminators 70 and 71 to direct light to the opposing surfaces the operator of the aligner bonder 20 is able to view on the monitor 40 areas of the two surfaces to be brought together. With the lower support position control drive 24, the operator can align the small features of the surfaces that are to be joined, i.e. the bumps and the pads of the above example. While viewing the monitor, the operator adjusts x, y and θ. The independent illuminators 70 and 71 and the independent video circuits 35 and 36 permit each of the superimposed images to be independently adjusted in intensity, brightness and contrast for the operator's best perception of the combined images, or one or the other of the superimposed images can be eliminated by reducing brightness at that image's circuit 35 or 36 for temporary viewing of a particular feature if necessary. Using the optics positioning provisions shown generally as the drive 41 in FIG. 2, with the joystick of the controller 25a, the operator moves the probe 28 to explore aligned areas of the facing surfaces of the chip and substrate, as illustrated at the video image 40a, until he or she is satisfied of the alignment in x, y and θ directions of the numerous minute contact points to be joined across the facing surfaces. A surface's image magnification can be varied by movement of the appropriate camera 32 or 33 along its particular light path. A micrometer type adjustment, diagrammatically shown at 39 in FIG. 3, can be used for modest magnification adjustments without readjusting the spacing of the probe to the pertinent surface for focus correction.

Figure 4:
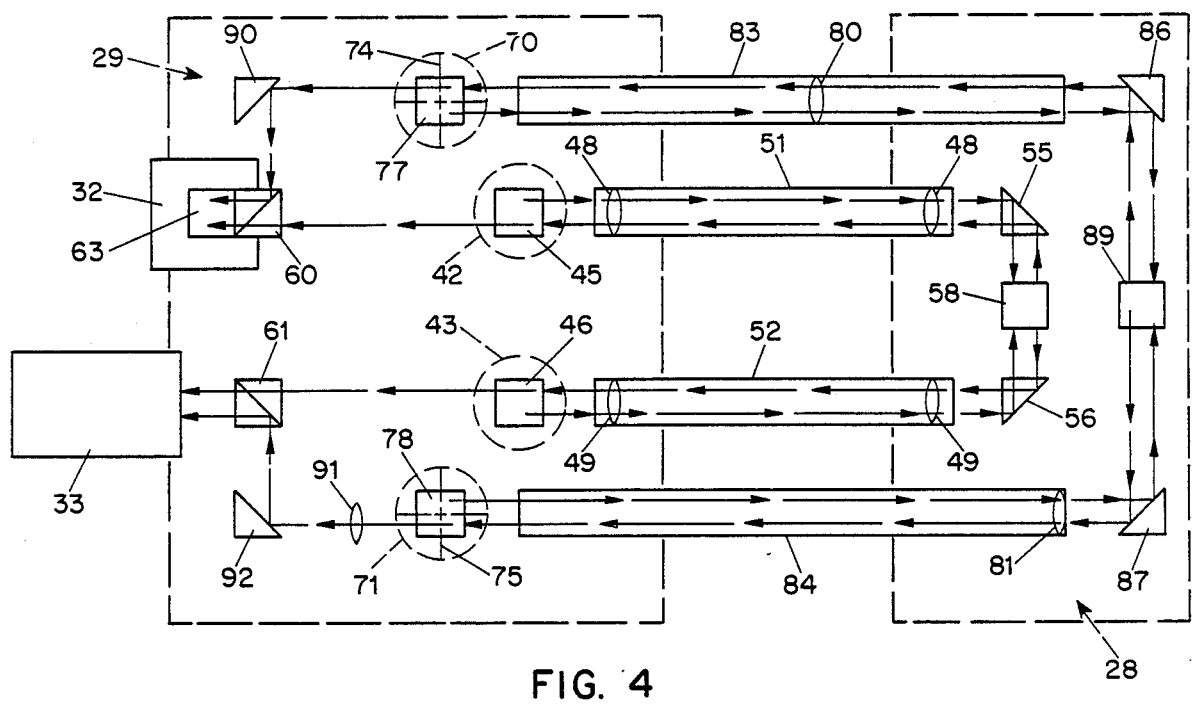
FIG. 4 is a schematic top plan view of the optical components and optical probe shown in FIG. 2 and illustrates image and light paths therein.

For the purpose of producing the video images of the facing surfaces to be joined, in the manner just described, the pair of illuminators 42 and 43, project light to the surfaces via a pair of beam splitters 45 and 46, seen in FIG. 4, pairs of lenses 48 and 49 in a pair of boroscopes 51 and 52, right angle prisms 55 and 56 with reflective hypotenuses functioning as fully reflective mirrors at 45°, and the second objective, a mirror cube 58, which, in effect, provides a two-sided mirror with its two reflective faces inclined at 45° with respect to the chip and substrate surfaces. The images of the illuminated surfaces are returned via the mirror cube 58, the prisms 55 and 56, the lenses 48 and 49 of the boroscopes 51 and 52, through the beam splitters 45 and 46, through the pair of beam splitter cubes 60 and 61, to the video cameras 32 and 33, the image of the substrate being reflected from one further mirror 63 to reverse that image and bring the two resultant video images into the correct relationship for superimposition with the aligned surface locations aligned in corresponding image locations.

Figure 5:
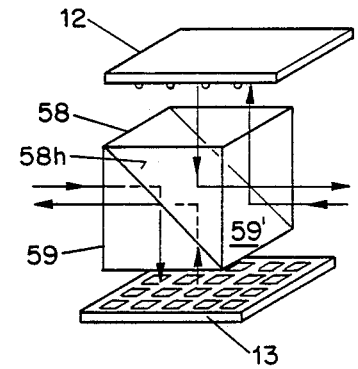
FIG. 5 is an enlarged top plan view of a mirror cube used in the optical probe of FIGS. 3 and 4.

FIG. 5 better illustrates the mirror cube 58. It measures 10 mm. on each edge. The cube is formed of two epoxied together right angle prisms with their hypotenuses, shown at 58h, coated to be reflective. The mirror cube diverts light entering its face 59 by 90° to illuminate the surface of the substrate 13 and likewise diverts light entering its face 59' to illuminate the surface of the chip 12. Images of the facing surfaces of the chip and substrate are diverted in just the opposite direction. Similarly the right angle prisms 55 and 56 have reflective hypotenuses to act, in effect, as 45° mirrors, and the beam splitters 60 and 61 are like the mirror cubes, but with partially reflective hypotenuses.

At the outset, before the aligner bonder can be used to determine either parallelism or alignment, calibration is required. To calibrate the aligner bonder 20, as seen in FIG. 7, a calibration reticle mount 101 replaces the upper support 22. The reticle mount 101 has a platen 102, and mounting provisions, not shown, that permit it to be flipped into place and clamped in the same manner as the support 22. In an aperture 104 a clear target reticle 105 is secured. A calibration bridge 110 is mounted in place above the calibration reticle mount 101 with its optical axis aligned with the target reticle 105. The calibration bridge 110 has microscope optics including an eye piece 112, and a microscope nose piece with a microscope objective 113 and an autocollimator objective 114, each movable alternately directly above the target reticle 105. An illuminator 115 is provided for directing light to and through the clear target reticle along the optical axis 118. An autocollimator 121 is positioned to direct collimated light along that axis to the target reticle 105. A micrometer-like adjusting assembly 122 includes a knurled, fine manual adjustment knob 123 to enable precise focusing by fine vertical adjustment of the location of the optics of the bridge.

Below the calibration reticle mount 101, the lower support 23 is formed by the generally cylindrical piston or riser 96. A lower target reticle 127 is located on the riser's upper surface 97, held there by vacuum applied through the opening 98 and the vacuum supply tube 99. As seen in both FIGS. 7 and 8, the riser 96 is movable in the Z axis direction on bearings 134, captive in vertical v-shaped slots, spaced 120° around the outer cylindrical surface of the riser. Rod-like bearing retainers 138 have similar v-shaped slots 139 retaining the bearings 134. The bearing retainers 138 are positioned in a sleeve 141. Sets of bearings 142 permit rotation of the sleeve 141 and riser 126 as a unit, with respect to a supporting, outer cylindrical bore 144 in a support member 145.

Prior to calibration, during the instrument's setup, the flat upper surface 97 of the riser 96 has been made perfectly horizontal, perpendicular to the optical axis 118. This was done by viewing the target reticle 127, or another target reticle, through the optics of the bridge 110, while illuminating the target using the illuminator 115 and rotating the riser 96 and sleeve 141. Lateral wandering of the target signifies inclination of the upper surface 97. Three series of adjusting screws 147 threaded through the sleeve 141 into engagement with the retainers 138 can be accessed through an opening 148 to correct the inclination of the riser 126 in the sleeve 141 until the centered target image remains centered as the riser and sleeve are turned.

For calibration, using the calibration bridge optics, the autocollimator objective 114, and the autocollimator 121, the target reticles 105 and 127 are viewed through the eyepiece 112. Support surface 97 is made parallel to and aligned with the upper target reticle 105 using the instrument's lower support position drives 24. When the upper and lower target reticles are coincident, the target reticles are parallel. The target reticles are moved very close together, so that both targets are nearly in focus when viewed through the eye piece, using the illuminator 115, the microscope optics and objective 113. Using the lower support position drives 24, x, y and $\theta$ are corrected until the target reticles appear coincident.

The lower support is retracted, and the optical probe 28 is moved into place between the upper target reticle 105 and the lower target reticle 127. Now, the optics of FIGS. 3 and 4 can be adjusted with confidence that when the images of the upper and lower reticles coincide, the optics have been correctly set. Adjustment of the optics entails such slight positional corrections of optical elements in the paths between the illuminators 42 and 43 to the cameras 32 and 33 as is necessary to bring the video images of the upper and lower target reticles into coincidence and such slight positional corrections to optical elements in the light paths from the autocollimators 70 and 71 to the cameras 32 and 33 as is necessary to bring into coincidence the video images of the cross hairs 74 and 75.

After a die and substrate have been made parallel and aligned as described above, the optics position drive 41 is used to retract the probe 28 from between the upper and lower supports 22 and 23. The die 12 and the substrate 13 are moved towards one another by moving the lower support 23 upward in tee z direction, first rapidly in a course z adjusting movement, then slowly in a fine z adjusting movement until the desired areas of the die and substrate engage, as detected by the load cell 125. Then pressure, vibration or heat, or a combination thereof, is applied to effect connection. In a preferred embodiment, sufficient pressure is applied to cause bonding of indium bumps to conductors of the substrate using the load cell 125 to monitor the force applied between the two parts and to control the z axis application of the force by the z direction drive of the drives 24.

By appropriate software, not a part of this invention, the CPU 25 provides status information, via a text formulating unit 150, to the mixer 38 for production of a window or image portion 40b. As the controller 25a is used to switch from, say, calibration to alignment and bonding of actual parts, that status can be displayed. If joystick control of the probe position is chosen, or control of the lower support x and y or $\theta$ positions is chosen, that can be displayed. Likewise, the monitor can indicate whether the instrument is set to establish parallelism or alignment using the collimators or the illuminators. The load cell reading can be displayed, so that contacting of the surfaces of the parts to be bonded can be recognized, and so that the pressure applied during bonding can be monitored. The brightness level of the illuminators or of the collimators can be controlled by the controller 25a and displayed. Bonding temperature of upper and/or lower parts can be shown if applicable, whether the upper or lower support vacuum, or both, is on, and whether the upper or lower surface, or both, is displayed can be shown on the video monitor 40. Operator convenience and ease of use, then, is considerably enhanced by the consolidation of information at the single video screen of the monitor 40.

As compared to many other aligning and bonding mechanisms, the relative vertical thinness of the probe 28, approximately $\frac{3}{8}$ inches, means that, once the probe is retracted after alignment, the die need only be moved a short distance before contacting the substrate. This reduces the likelihood of misaligning error being introduced by imprecision introducing lateral movement. During alignment, at the surfaces of the die and the substrate, lighting is along the optical axis perpendicular to the surfaces, so that troublesome shadowing does not occur as one attempts to align the two facing surfaces. The independently controllable video images and light sources enable the operator to adjust the superimposed images in the way that best enables him or her to perceive the relationship of the surfaces displayed.

The above and further advantages of the invention will be better understood with respect to the following detailed description of a preferred embodiment, taken in combination with the several figures of the associated drawings.

We claim:

1. An aligning and bonding tool for use in aligning and bonding locations on facing surfaces of parts of a miniaturized electronic component, comprising a first support means for supporting a first of said parts, second support means for supporting a second of said parts with the surface thereof facing the surface of the first part, means for controlling relative positioning of the first and second support means, an optical probe for movement into a position between the facing surfaces of the parts, illumination means for lighting each of the facing surfaces, optical means for directing an optical image of each of the facing surfaces away from the probe, and video means responsive to the optical images for combining the optical images of the facing surfaces into a single video image, whereby the means for controlling relative positioning of the first and second support means effects relative positioning of the video representation of the facing surface locations to be aligned to enable visual alignment of locations of the facing surfaces.

2. An aligning and bonding tool according to claim 1 wherein the means for controlling positioning further comprises means for bringing the aligned locations of the facing surfaces together to be connected.

3. An aligning and bonding tool according to claim 1 wherein the illumination means comprises a pair of light sources and the optical means comprises means for directing light from the light sources to the surfaces along portions of a pair of optical paths on which the images of the surfaces are returned towards the video means.

4. An aligning and bonding tool according to claim 1 wherein the video means comprises a pair of video cameras located to receive the surface images from the optical probe via the optical means, video mixing means for combining video signals corresponding to the images of the two surfaces, and a monitor for displaying the combined video images of the surfaces.

5. An aligning and bonding tool according to claim 4 wherein the video means further comprises first and second video adjusting means operatively connected to the first and second cameras, respectively, for providing individual video image adjustment of the video signals corresponding to each of the surface images.

6. An aligning and bonding tool according to claim 1 wherein the optical means comprises an inclined, two-sided mirror means on the probe at a location aligning with the locations on the first and second support means for the first and second parts, and means for receiving images reflected from reflective first and second sides of the two-sided mirror and directing the images towards the video means.

7. An aligning and bonding tool according to claim 6 wherein the means for receiving images reflected from the two-sided mirror are mirrors located to receive light from the illumination means and direct the light to the two-sided mirror, the two-sided mirror being located to reflect light from the first and second reflective surfaces thereof to the facing surfaces of the parts on the first and second support means on a path substantially perpendicular to the facing surfaces.

8. An aligning and bonding tool according to claim 1 further comprising means for projecting first and second reference images to the surfaces of parts on the first and second support means, said optical means comprising means for receiving the first and second projected reference images from the first and second surfaces and directing the reflected reference images to the video means, whereby the relationship of the reference images in a combined video image is dependent upon the relative inclination of one of the surfaces with respect to the other of the surfaces adjustable by the means for controlling relative positioning of the support means.

9. An aligning and bonding tool according to claim 8 wherein the means for projecting first and second reference images comprises a pair of autocollimators, a pair of image producing means in the path of collimated light from the autocollimators and means for directing the collimated light and the images of the image producing means to surfaces indicative of the inclination of surfaces of the parts to be joined on the support means.

10. An aligning and bonding tool according to claim 9 wherein the image producing means comprise means for producing cross hair images, the means for producing cross hair images being located in the path of autocollimated light such that video images of the cross hair images appear coincident in the combined video image when the facing surfaces of the parts are parallel.

11. An aligning and bonding tool according to claim 10 wherein the means for projecting first and second reference images comprises inclined two-sided mirror means on the probe at a location aligning with the locations on the first and second support means for the first and second parts, and means for directing the first and second reference images and collimated light to reflective first and second sides of the two-sided mirror.

12. An aligning and bonding tool according to claim 11 wherein the means for directing the first and second reference images and collimated light to reflective first and second sides of the two-sided mirror are mirrors located to direct light to first and second sides of the two sided mirrors, to receive the reference images on the indicative surfaces from the reflective first and second sides of the two-sided mirror, and to direct the reference images to the video means.

13. An aligner bonder for aligning and bonding regions of facing surfaces of parts of a semiconductor component such as an integrated circuit or the like comprising first and second video cameras, first and second individual video image adjusting circuitry means operatively connected to each of the first and second video cameras, respectively, for adjusting a video image produced by each camera, mixing means for combining image signals from the first and second video cameras, a monitor for displaying the combined video signals, first support means for supporting a first part of a semiconductor component having a first surface with regions thereon to be aligned and bonded, second support means for supporting a second part of a semiconductor component having a second surface with regions thereon to be aligned and bonded with the regions on the first part, the first and second support means supporting the first and second parts with the first and second surfaces facing each other and spaced a relatively short distance apart, optical means for transmitting first and second images from the first and second surfaces to the first and second video cameras, said optical means including a probe movable to and from a position between the first and second surfaces, and means for controlling the positioning of the first and second support means to align the regions of the first and second surfaces and to move the regions into engagement for bonding upon retraction of the probe.

14. An aligner bonder according to claim 13 wherein the optical means comprises image receiving means on the probe facing the first and second surfaces for receiving images of the first and second surfaces, and first and second optical paths from the image receiving means to the cameras, whereby a combined video image of the first and second surfaces is produced on the video monitor to display relative positioning of the regions on the first and second surfaces.

15. An aligner bonder according to claim 14 further comprising means for directing light to the first and second surfaces from the probe on paths substantially perpendicular to the surfaces.

16. An aligner bonder according to claim 13 wherein the optical means comprises reference image projecting means for projecting first and second reference images to the first and second surfaces, respectively, or reference surfaces parallel thereto, and reference image receiving means on the probe facing the first and second surfaces for receiving the first and second reference images, respectively, from the first and second surfaces or reference surfaces, reference image optical paths from the reference image receiving means to the cameras, whereby a combined video image of the first and second reference images is produced in which the relative positions of the reference images indicate the relative inclination of the first and second surfaces.

17. An aligner bonder according to claim 16 wherein the reference image projecting means comprises first and second autocollimators directing collimated light towards the first and second surfaces, and first and second reference mark image producing means, in the path of collimated light directed toward the first and second surfaces, for producing the first and second reference images.

18. The aligner bonder of claim 13 further comprising means for textually displaying data concerning the status of the aligner bonder in a window display on the monitor that displays the combined video signals.

19. A video-optical assembly for an aligner bonder comprising a probe, first and second two-sided mirror means located on the probe and each having two reflective faces inclined to reflect light directed thereto from opposite sides thereof in opposite directions therefrom, first and second pairs of mirrors located to direct light to the opposite reflective faces of the first and second two-sided mirror means and to receive images from the opposite reflective faces of the first and second two-sided mirror means, a pair of autocollimators, first and second reference image forming means in the paths of collimated light from the autocollimators, lenses in the paths of the collimated light from the autocollimators to the first pair of mirrors to provide the first and second reference images to the opposite reflective faces of the first of the two sided mirror means via the first pair of mirrors, first and second illumination means, and first and second means defining an optical path between the first and second illumination means and the second pair of mirrors to illuminate the reflective faces of the second two-sided mirror, first and second video cameras, and means for directing images to the first and second video cameras from the opposite reflective surfaces of the first and second two-sided mirror means.

20. The method of aligning for bonding the facing surfaces of first and second parts of a miniature semiconductor device comprising supporting the first and second parts with the facing surfaces thereof spaced apart, providing an optical probe having a two-sided mirror secured thereon diagonally with respect to the facing surfaces, introducing the probe between the facing surfaces, providing first and second video cameras, directing images of the surfaces from opposite reflective faces of the two-sided mirror along optical paths to the video cameras, combining outputs of the video camera, displaying a combined image of the facing surfaces on a video monitor, adjusting the relative positions of the facing surfaces until locations to be brought together are aligned in the video image, withdrawing the optical probe, moving the first and second parts together until the facing surface locations to be brought together contact, and bonding the contacting locations.

21. The method according to claim 20 further comprising the step of illuminating the facing surfaces by directing light along at least a portion of each of the optical paths to the two-sided mirror.

22. The method according to claim 20 further comprising projecting first and second reference images to the facing surfaces of the first and second parts respectively or parallel reference surfaces, directing the first and second reference images from the facing surfaces along reference image optical paths to the video cameras, displaying a combined image of the first and second reference images on the video monitor, and adjusting the relative inclination of the facing surfaces by adjusting the relationship of the reference images in the video display before moving the first and second parts together.

23. The method according to claim 22 wherein the step of directing the first and second reference images from the facing surfaces along optical paths to the video cameras comprises providing a second two-sided mirror on the optical probe positioned diagonally with respect to the facing surfaces and directing reflections of the first and second reference images on the facing surfaces or reference surfaces to the reference image optical paths.

24. The method according to claim 23 wherein the step of projecting first and second reference images comprises providing first and second autocollimators, locating first and second image forming means in the path of collimated light from the first and second autocollimators, directing the collimated light and the first and second reference images of the image forming means to the second two-sided mirror, and reflecting the first and second reference surfaces from the opposite reflective surfaces of the second two-sided mirror to the facing surfaces of the first and second parts.

* * * * *